(12) United States Patent
Yu et al.

(10) Patent No.: US 11,119,597 B2
(45) Date of Patent: Sep. 14, 2021

(54) TOUCH SENSOR AND DISPLAY DEVICE COMPRISING SAME

(71) Applicant: DONGWOO FINE-CHEM CO., LTD., Iksan-si (KR)

(72) Inventors: Sungwoo Yu, Hwaseong-si (KR); Dongjin Son, Asan-si (KR); Byung Hoon Song, Hwaseong-si (KR); Hodong Yoon, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 16/962,584

(22) PCT Filed: Jan. 10, 2019

(86) PCT No.: PCT/KR2019/000389
§ 371 (c)(1),
(2) Date: Jul. 16, 2020

(87) PCT Pub. No.: WO2019/143065
PCT Pub. Date: Jul. 25, 2019

(65) Prior Publication Data
US 2020/0401259 A1    Dec. 24, 2020

(30) Foreign Application Priority Data

Jan. 18, 2018  (KR) .................. 10-2018-0006664
Dec. 26, 2018  (KR) .................. 10-2018-0169366

(51) Int. Cl.
*G06F 3/041*    (2006.01)
*H01L 27/32*    (2006.01)
*G06F 3/044*    (2006.01)
*G02F 1/1333*   (2006.01)

(52) U.S. Cl.
CPC ........ *G06F 3/0412* (2013.01); *G02F 1/13338* (2013.01); *G06F 3/044* (2013.01); *H01L 27/323* (2013.01)

(58) Field of Classification Search
CPC .... G06F 3/0412; G06F 3/044; G02F 1/13338; H01L 27/323
See application file for complete search history.

(56) References Cited

U.S. PATENT DOCUMENTS

2018/0258332 A1* 9/2018 Song ................ C09J 183/04
2018/0297349 A1* 10/2018 Lim ..................... B32B 7/12
2019/0220151 A1* 7/2019 Mitsui ............... B32B 27/302

FOREIGN PATENT DOCUMENTS

KR   10-2015-0081568 A    7/2015
KR      10-1579710 B1    12/2015
KR   10-2016-0085036 A    7/2016
(Continued)

OTHER PUBLICATIONS

International Search Report for PCT/KR2019/000389 dated Apr. 22, 2019 (PCT/ISA/210).

*Primary Examiner* — Peter D McLoone
(74) *Attorney, Agent, or Firm* — Sughrue Mion, PLLC

(57) ABSTRACT

Provided is a thin touch sensor having excellent flexibility and durability against bending. A thin adhesive layer with a high elastic modulus under the touch sensing electrode pattern serves as a substrate, and a thick adhesive layer with a low elastic modulus on top of the touch sensor layer disperses the stress of the optical film.

14 Claims, 1 Drawing Sheet

(56) References Cited

FOREIGN PATENT DOCUMENTS

| KR | 10-2017-0043301 A | 4/2017 |
| KR | 10-2017-0044385 A | 4/2017 |
| WO | 2014/142263 A1 | 9/2014 |

\* cited by examiner

[Figure 1]
10
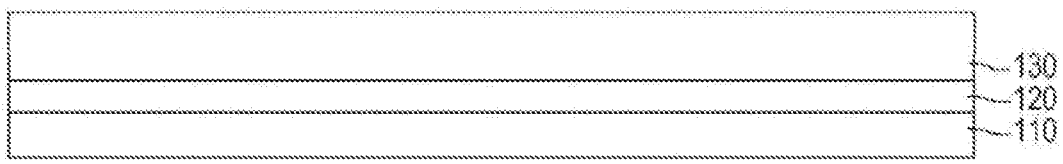
[Figure 2]
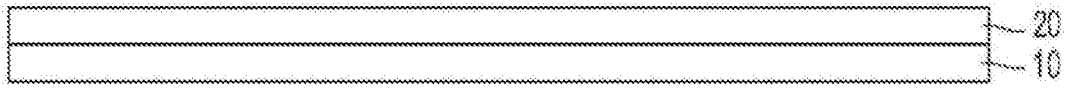
[Figure 3]
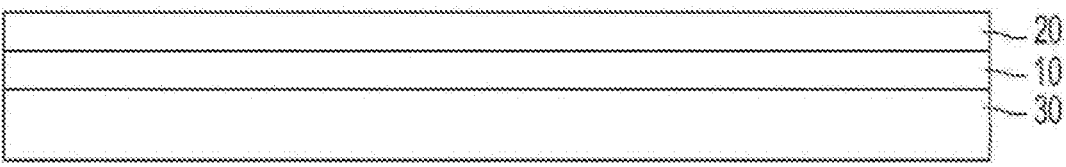

TOUCH SENSOR AND DISPLAY DEVICE COMPRISING SAME

CROSS REFERENCE TO RELATED APPLICATIONS

This is a National Stage of International Application No. PCT/KR2019/000389 filed Jan. 10, 2019, claiming priority based on Korean Patent Application No. 10-2018-0006664 filed Jan. 18, 2018 and Korean Patent Application No. 10-2018-0169366 filed Dec. 26, 2018, the contents of all of which are incorporated herein by reference in their entirety.

TECHNICAL FIELD

The present invention relates to a touch sensor and a display device including the same.

BACKGROUND ART

Recently, a touch input method in which a user directly touches a screen using a finger to input is widely applied to a display device. The touch input method can provide an intuitive and convenient user interface by allowing a user to touch a specific location on the display screen to input.

In addition, the touch input method can be combined with a display screen without a separate input device such as a keyboard or mouse, which is particularly advantageous for portable electronic devices.

In order to use a touch sensor in a portable electronic device, reduction of weight and thickness is required. As a flexible display device has been developed to maximize convenience of use, the touch sensor is also required to have flexibility.

For example, Korean Patent Application Publication No. 10-2016-0085036 discloses a film touch sensor comprising a touch electrode plate including a touch sensing pattern, an adhesive layer formed on the touch electrode plate, and a base film formed on the adhesive layer, wherein the following conditions are simultaneously satisfied: the compressive elastic modulus and the thickness of the touch electrode plate are 100 to 6000 MPa and 1 to 40 µm, respectively, the tensile elastic modulus and the thickness of the adhesive layer are 0.01 to 10 MPa and 5 to 100 µm, respectively, and the tensile elastic modulus and the thickness of the base film are 50 to 6000 MPa and 20 to 300 µm, respectively, improving flexibility and durability simultaneously to be suitable for application to a flexible display and preventing crack or breakage when formed on a carrier substrate and peeled off from the carrier substrate.

DISCLOSURE OF INVENTION

Technical Problem

The present invention has been made on the basis of the technical background as described above, and has an object of providing a flexible and durable thin film touch sensor.

Technical Solution

A touch sensor of the present invention for achieving this object may be configured to comprise a lower adhesive layer, a touch sensor layer, and an upper adhesive layer.

The touch sensor layer may be combined on the lower adhesive layer and include a touch sensing electrode pattern.

The upper adhesive layer may be combined on the touch sensor layer. The upper adhesive layer may be thicker than the lower adhesive layer and have a lower elastic modulus than that of the lower adhesive layer.

In the touch sensor according to the present invention, the lower adhesive layer may have a thickness of 2 to 20 µm and an elastic modulus of 0.5 to 5.0 MPa, The upper adhesive layer may have a thickness of 5 to 50 µm and an elastic modulus of 0.05 to 1.00 MPa.

When the thickness of the upper adhesive layer is T1 and the thickness of the lower adhesive layer is T2, T1/T2 may have a value between 1.1 and 5.0.

When the elastic modulus of the upper adhesive layer is M1 and the elastic modulus of the lower adhesive layer is M2, M2/M1 may have a value between 1.16 and 20.0.

In the touch sensor according to the present invention, the upper adhesive layer and the lower adhesive layer may be made of OCA (Optically Clear Adhesive).

The touch sensor according to the present invention may not comprise a base film.

A laminate according to the present invention may comprise the touch sensor described above and a window bonded with the touch sensor through the upper adhesive layer.

In the laminate according to the present invention, the window may be provided with a hard coating film.

The laminate according to the present invention may further comprise a polarizing layer including a polarizer on one surface of the window.

In the laminate according to the present invention, the window may further include a colored light-shielding pattern printed around an edge of at least one surface of the polarizing layer.

A display device according to the present invention may comprise the touch sensor described above, a window bonded with the touch sensor through the upper adhesive layer, and a display layer bonded with the touch sensor through the lower adhesive layer.

In the display device according to the present invention, the window may be provided with a hard coating film.

The display device according to the present invention may further comprise a polarizing layer including a polarizer on one surface of the window.

In the display device according to the present invention, the window may further include a colored light-shielding pattern printed around an edge of at least one surface of the polarizing layer.

In the display device according to the present invention, the display layer may be an LCD layer or an OLED layer.

Advantageous Effects

According to the touch sensor in accordance with the present invention, an adhesive layer having a low thickness and a high elastic modulus under the touch sensing electrode pattern serves as a substrate, and another adhesive layer having a high thickness and a low elastic modulus on top of the touch sensor layer can disperse the stress of the optical film. Accordingly, while providing flexibility and durability against bending, a thinned touch sensor can be provided. In particular, such a touch sensor has excellent bending resistance under infolding conditions.

DESCRIPTION OF DRAWINGS

FIG. 1 is a sectional view of a touch sensor according to an embodiment of the present invention.

FIG. 2 is a sectional view of a laminate structure according to an embodiment of the present invention.

FIG. 3 is a sectional view of a display device according to an embodiment of the present invention.

BEST MODE

Hereinafter, a touch sensor according to the present invention and a display device including the same will be described in detail with reference to the drawings. However, the drawings attached to the present specification are only examples for explaining the present invention, and the present invention is not limited by the drawings. In addition, for convenience of description, some components may be exaggerated, reduced, or omitted in the drawings.

FIG. 1 is a sectional view of a touch sensor according to an embodiment of the present invention.

Referring to FIG. 1, the touch sensor 10 according to an embodiment of the present invention comprises a touch sensor layer 120 formed without a base film, and an upper adhesive layer 130 and a lower adhesive layer 110 formed on upper and lower portions of the touch sensor layer 120, respectively.

The touch sensor layer 120 includes a touch sensing electrode pattern for sensing a touch input, and various electrode patterns known in this field can be used without limitation. For example, an electrode pattern used in a capacitive touch sensor may be included, and a mutual-capacitance method or a self-capacitance method may be applied.

In the case of the mutual-capacitance method, it may have a grid pattern of horizontal and vertical axes. A bridge electrode may be included at an intersection of electrodes on the horizontal axis and the vertical axis.

In the case of the self-capacitance method, it is possible to have an electrode pattern in which a change in capacitance is read using one electrode at each point.

The material for forming the electrode pattern is not particularly limited, and a transparent material with a suitable conductivity can be mainly used. It may be formed of one or more materials selected from metal, metal nanowire, metal oxide, carbon nanotube, graphene, conductive polymer and conductive ink, for example.

Here, the metal may be any one of gold, silver, copper, molybdenum, aluminum, palladium, neodymium, platinum, zinc, tin, and titanium, or alloys thereof.

Further, the metal nanowire may be any one of silver nanowire, copper nanowire, zirconium nanowire, and gold nanowire.

In addition, the metal oxide may be any one of indium tin oxide (ITO), indium zinc oxide (IZO), indium zinc tin oxide (IZTO), aluminum zinc oxide (AZO), gallium zinc oxide (GZO), fluorine tin oxide (FTO), and zinc oxide (ZnO).

In addition, the electrode pattern may be formed of a carbon-based material including carbon nanotube (CNT) or graphene.

The conductive polymer includes polypyrrole, polythiophene, polyacetylene, PEDOT, and polyaniline, and the conductive ink includes an ink in which a metal powder and a curable polymer binder are mixed.

In addition, the electrode pattern may be formed of a laminate structure of two or more conductive layers in order to reduce electrical resistance, if needed.

The electrode pattern may be formed of one layer of ITO, AgNW (silver nanowire), or metal mesh in an embodiment. If it is formed to have two or more layers, a first electrode layer may be formed of a transparent metal oxide such as ITO, and a second electrode layer may be formed on the ITO electrode layer using metal, AgNW, or the like in order to further reduce the resistance.

The touch sensor layer 120 of the touch sensor 10 according to an embodiment of the present invention has a structure formed without a base film, and an electrode pattern is formed on a thin protective film (not shown) having a thickness of several μm. Further, the touch sensor layer 120 may be formed, for example, by forming a protective film and an electrode pattern on a carrier substrate and then transferring them.

The upper adhesive layer 130 on top of the touch sensor layer 120 is a layer that serves to bond components of a display device such as an optical film on the touch sensor layer 120. Here, "upper" refers to a side on which the user's touch input is made with reference to the touch sensor layer 120. According to an embodiment of the present invention, the upper adhesive layer 130 has a thickness of 5 to 50 μm and an elastic modulus of 0.05 to 1.00 MPa (at 25° C.). If these conditions are satisfied, the stress of the optical film is dispersed when the optical film is attached to the top of the touch sensor layer 120, which prevents the stress from being transmitted to the touch sensor layer. Accordingly, no crack or breakage occurs when the touch sensor 10 is bent or curved.

The lower adhesive layer 110 under the touch sensor layer 120 is a layer that serves to support the touch electrode pattern in the structure of the touch sensor layer 120 having no base film and to bond a display layer to the lower portion of the touch sensor layer 120 at the same time. Here, "lower" refers to a side opposite to the side on which the user's touch input is made with reference to the touch sensor layer 120. According to an embodiment of the present invention, the lower adhesive layer 110 has a thickness of 2 to 20 μm and an elastic modulus of 0.5 to 5 MPa (at 25° C.). As described above, when the thickness of the lower adhesive layer 110 is low and the elastic modulus thereof is high, a supporting role may be performed in the structure of the touch sensor layer 120 having no base film, and the stress applied to the touch sensor layer 120 is transmitted downward to prevent the touch sensor 10 from crack or breakage when bent or curved.

In particular, when the thickness of the upper adhesive layer 130 is T1 and the thickness of the lower adhesive layer 110 is T2, it is preferable that T1/T2 has a value between 1.1 and 5.0. In addition, when the elastic modulus of the upper adhesive layer 130 and the lower adhesive layer 110 are M1 and M2, respectively, M2/M1 preferably has a value between 1.16 and 20.0.

When these conditions are satisfied, no crack or breakage occurs when the touch sensor 10 is bent or curved, and thus it is very suitable for use in a flexible display device. In particular, it shows excellent bending resistance under infolding conditions in which the touch sensor 10 is bent such that the upper adhesive layer 130 is located inside and the lower adhesive layer 110 is to be outside.

For the upper and lower adhesive layers, adhesive materials known in the art can be applied without limitation as long as the above properties are satisfied. For example, a pressure sensitive adhesive composition including an acrylic copolymer, crosslinking agent, and silane coupling agent as an OCA (Optically Clear Adhesive) may be used.

It is preferable that the acrylic copolymer usable in the present invention contains a (meth)acrylate monomer and an ionic monomer having a vinyl group. In the present invention, (meth)acrylate means acrylate or methacrylate.

Examples of the (meth)acrylate monomer include n-butyl (meth)acrylate, 2-butyl (meth)acrylate, t-butyl (meth)acrylate, 2-ethylhexyl (meth)acrylate, ethyl (meth)acrylate, methyl (meth)acrylate, n-propyl (meth)acrylate, isopropyl (meth)acrylate, pentyl (meth)acrylate, n-octyl (meth)acrylate, isooctyl (meth)acrylate, nonyl (meth)acrylate, decyl (meth)acrylate, lauryl (meth)acrylate, and the like. Among these, n-butyl acrylate, 2-ethylhexyl acrylate, or a mixture thereof is preferable. These may be used alone or in combination of two or more.

The ionic monomer having a vinyl group is preferably contained in 0.1 to 10 parts by weight based on 100 parts by weight of the (meth)acrylate monomer, and more preferably 0.5 to 5 parts by weight. If the content is less than 0.1 part by weight, the effect of improving the compatibility of an antistatic agent may be insufficient to secure durability, and when it exceeds 10 parts by weight, hydrophilicity may be excessively high, and thus it may be difficult to ensure heat and moisture resistance.

The acrylic copolymer of the present invention may further contain a polymerizable monomer having a crosslinkable functional group in addition to the ionic monomer having the vinyl group. The polymerizable monomer having a crosslinkable functional group may be a component that can impart durability and cuttability by reinforcing the cohesive strength or adhesive strength of the pressure sensitive adhesive composition by chemical bonding and does not generate hydrogen ions (H+).

Examples of the polymerizable monomer having a crosslinkable functional group include a monomer having a hydroxy group, a monomer having an amide group, a monomer having a tertiary amine group, and the like, and these can be used alone or in combination of two or more.

Examples of the monomer having a hydroxy group include 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, 2-hydroxyethylene glycol (meth)acrylate, 2-hydroxypropylene glycol (meth)acrylate, hydroxyalkylene glycol (meth)acrylate having 2 to 4 carbon atoms in the alkylene group, 4-hydroxybutyl vinyl ether, 5-hydroxypentyl vinyl ether, 6-hydroxyhexyl vinyl ether, 7-hydroxyheptyl vinyl ether, 8-hydroxyoctyl vinyl ether, 9-hydroxynonyl vinyl ether, 10-hydroxydecyl vinyl ether, and the like, and 4-hydroxybutyl vinyl ether is preferable among these.

Examples of the monomer having an amide group include (meth)acrylamide, N-isopropyl acrylamide, N-tertiary butyl acrylamide, 3-hydroxypropyl (meth)acrylamide, 4-hydroxybutyl (meth)acrylamide, 6-hydroxyhexyl (meth)acrylamide, 8-hydroxyoctyl (meth)acrylamide, 2-hydroxyethylhexyl (meth)acrylamide, and the like, and (meth)acrylamide is preferred among these.

Examples of the monomer having a tertiary amine group include N,N-(dimethylamino) ethyl (meth)acrylate, N,N-(diethylamino) ethyl (meth)acrylate, N,N-(dimethylamino) propyl (meth)acrylates, and the like.

It is preferable that the polymerizable monomer having a crosslinkable functional group is contained in 0.05 to 10 parts by weight, more preferably 0.1 to 8 parts by weight based on 100 parts by weight of the (meth)acrylate monomer having an alkyl group having 1 to 12 carbon atoms. If the content is less than 0.05 parts by weight, the cohesive force of the pressure sensitive adhesive may be reduced, and durability may be deteriorated. If the content is more than 10 parts by weight, adhesive strength may be reduced due to a high gel fraction and may cause durability problems.

In addition, the acrylic copolymer of the present invention may further contain other polymerizable monomers in addition to the above monomers in a range that does not decrease the adhesive strength, for example, 10 parts by weight or less based on the total amount.

The method for producing the copolymer is not particularly limited. It can be prepared using a method commonly used in the art such as bulk polymerization, solution polymerization, emulsion polymerization or suspension polymerization, and solution polymerization is preferred. In addition, solvents, polymerization initiators, chain transfer agents for molecular weight control, etc., which are usually used in polymerization, can be used.

The acrylic copolymer preferably has a weight average molecular weight (in terms of polystyrene, Mw) of 50,000 to 2,000,000 measured by gel permeation chromatography (GPC), and more preferably 400,000 to 2,000,000. When the weight average molecular weight is less than 50,000, cohesion between the copolymers is insufficient, which may cause adhesion durability problems. When it exceeds 2,000,000, a large amount of diluting solvent may be required to ensure processability during coating.

The crosslinking agent usable in the present invention is a component that enables the adhesive layer to satisfy the above-mentioned elastic modulus with proper crosslinking degree, and it is possible to use, for example, isocyanate-based, epoxy-based, melamine-based, peroxide-based, metal chelate-based, oxazoline-based crosslinking agents, etc. Ii is preferable to use an isocyanate-based or metal chelate-based agent in view of realizing proper viscoelasticity by forming a crosslink with an acrylic copolymer.

Examples of the isocyanate-based compound include diisocyanate compounds such as tolylene diisocyanate, xylene diisocyanate, 2,4-diphenylmethane diisocyanate, diphenylmethane diisocyanate, hexamethylene diisocyanate, isophorone diisocyanate, tetramethyl xylene diisocyanate, naphthalene diisocyanate, adducts obtained by reacting 3 moles of diisocyanate compounds with 1 mole of polyhydric alcohol-based compounds such as trimethylolpropane, isocyanurates obtained by self-condensing 3 moles of diisocyanate compounds, burettes obtained by condensing diisocyanate urea obtained from 2 moles of 3 moles of diisocyanate compounds with remaining 1 mole of diisocyanates, and polyfunctional isocyanate compounds containing three functional groups such as triphenylmethane triisocyanate, methylenebis triisocyanate, etc.

Examples of the epoxy-based compound include ethylene glycol diglycidyl ether, diethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, polytetramethylene glycol diglycidyl ether, glycerol diglycidyl ether, glycerol triglycidyl ether, diglycerol polyglycidyl ether, polyglycerol polyglycidyl ether, resolcin diglycidyl ether, 2,2-dibromoneopentyl glycol diglycidyl ether, trimethylolpropane triglycidyl ether, pentaerythritol polyglycidyl ether, sorbitol polyglycidyl ether, diglycidyl adipic acid ester, diglycidyl phthalate, tris (glycidyl) isocyanurate, tris (glycidoxyethyl) isocyanurate, 1,3-bis (N,N-glycidylaminomethyl) cyclohexane, N,N,N,N-tetraglycidyl-m-xylylenediamine, and the like.

Examples of the metal chelate-based compound include compounds in which acetyl acetone or ethylaceto acetate is coordinated with polyvalent metal such as aluminum (Al), iron (Fe), zinc (Zn), tin (Sn), titanium (Ti), antimony (Sb), magnesium (Mg), and vanadium (Va).

Examples of the melamine-based compound include hexamethylol melamine, hexamethoxymethyl melamine, and hexabutoxymethyl melamine, and the like.

Now, a laminate structure including a touch sensor according to the present invention is described.

FIG. 2 is a sectional view of a laminate structure according to an embodiment of the present invention.

Referring to FIG. 2, the laminate structure according to an embodiment of the present invention comprises the touch sensor 10 according to an embodiment of the present invention as described above and a window 20 on top of the touch sensor 10.

The touch sensor 10 and the window 20 may be bonded through the upper adhesive layer (FIG. 1: 130) of the touch sensor 10.

The window 20 is provided with a hard coating film, and may include a polarizing layer (not shown) including a polarizer on one surface of the window 20. In addition, if necessary, the window 20 may include a polarizing layer on which a protective film is placed with an adhesive layer interposed therebetween.

In addition, a colored light-shielding pattern printed around an edge of at least one surface of the window 20 or the polarizing layer may be provided, and the light-shielding pattern may be in the form of a single layer or multiple layers.

The polarizing layer may be, for example, continuously extended over a non-display area or a bezel portion, and may be a conventional polarizing plate including a polyvinyl alcohol-based polarizer and a protective film attached to at least one surface of the polyvinyl alcohol-based polarizer. Other examples of the polarizing layer include a liquid crystal coating layer including a polymerizable liquid crystal compound and a dichroic dye, and may further include an alignment layer for imparting alignment to the liquid crystal coating layer.

Now, a display device including a touch sensor according to the present invention is described.

FIG. 3 is a sectional view of a display device according to an embodiment of the present invention.

Referring to FIG. 3, the display device according to an embodiment of the present invention comprises the touch sensor 10 according to an embodiment of the present invention as described above, a window 20 on top of the touch sensor 10, and a display layer 30 under the touch sensor 10.

The window 20 may be the same as described with reference to FIG. 2. When the window 20 includes a polarization layer, there is an advantage that the pattern of the touch sensor 10 is not well recognized because the touch sensor 10 is located under the polarization layer based on the viewing side. In particular, the touch sensor 10 according to an embodiment of the present invention has no base film so that the touch sensor 10 may have a structure that is transferred to the window 20. When the window 20 includes a polarization layer, the touch sensor 10 may be transferred onto the polarization layer.

The display layer 30 may be anything that can be applied to a flexible display device, without limitation. For example, an OLED layer or an LCD layer may be used but it is not limited thereto.

Examples and Comparative Examples

Touch sensors having the upper and lower adhesive layers of various thicknesses and elastic moduli were prepared to evaluate the durability against bending.

The durability evaluation was a folding test performed by folding and unfolding the center of the manufactured touch sensor. The radius at the time of folding was set to 1R (radius 1 mm), and the number of folding was based on 10,000 times.

For the touch function, the ITO opening or short circuit of the touch sensor before and after the durability evaluation was observed based on the output value from the driver IC after FPCB bonding, and it was determined as OK if there was no problem.

For the trace crack and the polarizing layer crack, the trace and the polarizing layer were visually checked after the folding test, and it was determined as OK if there were no cracks.

Table 1 below shows the results of the durability evaluation.

TABLE 1

| | upper adhesive layer | | lower adhesive layer | | | | | | |
| --- | --- | --- | --- | --- | --- | --- | --- | --- | --- |
| | thickness (μm) | elastic modulus (MPa) | thickness (μm) | elastic modulus (MPa) | touch function | trace crack | polarizing layer crack | T1/T2 | M2/M1 |
| Example 1 | 25 | 0.05 | 5 | 0.90 | OK | OK | OK | 5.00 | 18.00 |
| Example 2 | 20 | 0.10 | 5 | 0.90 | OK | OK | OK | 4.00 | 9.00 |
| Example 3 | 15 | 0.40 | 5 | 0.50 | OK | OK | OK | 3.00 | 1.25 |
| Example 4 | 50 | 0.05 | 20 | 0.90 | OK | OK | OK | 2.50 | 18.00 |
| Example 5 | 5 | 0.50 | 2 | 5.00 | OK | OK | OK | 2.50 | 10.00 |
| Example 6 | 40 | 0.10 | 10 | 2.00 | OK | OK | OK | 4.00 | 20.00 |
| Example 7 | 10 | 0.50 | 9 | 0.60 | OK | OK | OK | 1.10 | 1.20 |
| Example 8 | 10 | 0.60 | 8 | 0.70 | OK | OK | OK | 1.25 | 1.16 |
| Example 9 | 10 | 1.00 | 5 | 1.50 | OK | OK | OK | 2.00 | 1.50 |
| Comparative Example 1 | 5 | 0.90 | 5 | 0.90 | OK | OK | NG | 1.00 | 1.00 |
| Comparative Example 2 | 10 | 0.20 | 5 | 5.00 | NG | NG | NG | 2.00 | 25.00 |
| Comparative Example 3 | 25 | 0.03 | 25 | 0.05 | NG | NG | OK | 1.00 | 1.60 |
| Comparative Example 4 | 20 | 0.10 | 25 | 0.05 | NG | NG | OK | 0.80 | 0.50 |
| Comparative Example 5 | 15 | 0.50 | 25 | 0.05 | NG | NG | OK | 0.60 | 0.10 |
| Comparative | 4 | 0.90 | 25 | 0.05 | NG | NG | NG | 0.16 | 0.05 |

TABLE 1-continued

|  | upper adhesive layer | | lower adhesive layer | | | | | | |
|---|---|---|---|---|---|---|---|---|---|
|  | thickness (μm) | elastic modulus (MPa) | thickness (μm) | elastic modulus (MPa) | touch function | trace crack | polarizing layer crack | T1/T2 | M2/M1 |
| Example 6 |  |  |  |  |  |  |  |  |  |
| Comparative Example 7 | 60 | 0.20 | 10 | 6.00 | NG | NG | OK | 6.00 | 30.00 |
| Comparative Example 8 | 100 | 0.10 | 10 | 0.90 | NG | NG | OK | 10.00 | 9.00 |

As shown in Table 1 above, in Examples 1 to 9 in which the touch function is excellent and no crack is observed in the trace and the polarizing layer, the thickness T1 and elastic modulus M1 of the upper adhesive layer were 5 to 50 μm and 0.05 to 1.00 MPa, respectively, and the thickness T2 and elastic modulus M2 of the lower adhesive layer were 2 to 20 μm and 0.5 to 5 MPa, respectively. On the other hand, Comparative Examples 1 to 8 had problems in at least one evaluation criterion among the touch function, trace crack, and polarization layer crack. However, the thickness T1 and elastic modulus M1 of the upper adhesive layer and the thickness T2 and elastic modulus M2 of the lower adhesive layer of some of Comparative Examples 1 to 8 satisfied the ranges of the thickness and elastic modulus of Examples 1-9 which passed all of the evaluation criteria of the touch function, trace crack, and polarization layer crack.

However, if the thickness ratio and elastic modulus ratio of the upper adhesive layer and the lower adhesive layer are further examined, it can be confirmed that Examples 1 to 9, which passed all of the evaluation criteria (touch function, trace crack, and polarization layer crack) are distinguished from Comparative Examples 1 to 8, which do not satisfy at least one of the evaluation criteria. That is, when the thickness of the upper adhesive layer is T1 and the thickness of the lower adhesive layer is T2, T1/T2 has a value between 1.1 and 5.0 in Examples 1 to 9. In addition, when the elastic modulus of the upper adhesive layer is M1 and the elastic modulus of the lower adhesive layer is M2, M2/M1 has a value between 1.16 and 20.0 in Examples 1 to 9. On the other hand, the thickness ratio and elastic modulus ratio of Comparative Examples 1-8 deviate from the ranges of those of Examples 1-9.

Therefore, in order to meet the evaluation of folding durability in the touch sensor having a structure in which the lower adhesive layer, the touch sensor layer, and the upper adhesive layer are stacked, the upper adhesive layer should be thicker than the lower adhesive layer and the upper adhesive layer should have a lower elastic modulus than that of the lower adhesive layer.

Further, as a detailed condition that satisfies the folding durability evaluation, it can be suggested that the thickness T1 and elastic modulus M1 of the upper adhesive layer are 5 to 50 μl and 0.05 to 1.00 MPa, respectively, the thickness T2 and elastic modulus M2 of the lower adhesive layer are 2 to 20 μm and 0.5 to 5.0 MPa, respectively, the thickness ratio of the upper adhesive layer and the lower adhesive layer, that is, T1/T2 has a value between 1.1 and 5.0, and the elastic modulus ratio of the lower adhesive layer and the upper adhesive layer, that is, M2/M1 has a value between 1.16 and 20.0.

The preferred embodiments of the present invention have been described with reference to the drawings. However, the present invention is not limited to the above-described embodiments, it will be understood that the present invention can be implemented in a modified form without departing from the essential characteristics of the present invention. The above-described embodiments of the present invention can be applied independently or in combination with some or all of its features.

Therefore, the scope of the present invention is defined by the claims rather than the foregoing description, and all differences within the equivalent range should be interpreted as being included in the present invention.

DESCRIPTION OF REFERENCE NUMERALS

| 110: lower adhesive layer | 120: touch sensor layer |
|---|---|
| 130: upper adhesive layer | 10: touch sensor |
| 20: window | 30: display layer |

The invention claimed is:

1. A touch sensor comprising:
a lower adhesive layer;
a touch sensor layer including a touch sensing electrode pattern formed on the lower adhesive layer; and
an upper adhesive layer on the touch sensor layer, wherein the upper adhesive layer is thicker than the lower adhesive layer, and the upper adhesive layer has a lower elastic modulus than that of the lower adhesive layer,
wherein the lower adhesive layer has a thickness of 2 to 20 μm and an elastic modulus of 0.5 to 5.0 MPa,
wherein the upper adhesive layer has a thickness of 5 to 50 μm and an elastic modulus of 0.05 to 1.00 MPa,
when the thickness of the upper adhesive layer is T1 and the thickness of the lower adhesive layer is T2, T1/T2 has a value between 1.1 and 5.0, and,
when the elastic modulus of the upper adhesive layer is M1 and the elastic modulus of the lower adhesive layer is M2, M2/M1 has a value between 1.16 and 20.0.

2. The touch sensor according to claim 1, wherein the upper adhesive layer and the lower adhesive layer are made of OCA (Optically Clear Adhesive).

3. The touch sensor according to claim 2, wherein the touch sensor does not comprise a base film.

4. A laminate, comprising:
the touch sensor according to claim 3; and
a window bonded with the touch sensor through the upper adhesive layer.

5. A display device, comprising:
the touch sensor according to claim 3;
a window bonded with the touch sensor through the upper adhesive layer; and
a display layer bonded with the touch sensor through the lower adhesive layer.

6. A laminate, comprising:
the touch sensor according to claim 2; and
a window bonded with the touch sensor through the upper adhesive layer.

7. A display device, comprising:
the touch sensor according to claim 2;
a window bonded with the touch sensor through the upper adhesive layer; and
a display layer bonded with the touch sensor through the lower adhesive layer.

8. A laminate, comprising:
the touch sensor according to claim 1; and
a window bonded with the touch sensor through the upper adhesive layer.

9. The laminate according to claim 8, wherein the window is provided with a hard coating film, and further comprises a polarizing layer including a polarizer on one surface of the window.

10. The laminate according to claim 9, wherein the window further includes a colored light-shielding pattern printed around an edge of at least one surface of the polarizing layer.

11. A display device, comprising:
the touch sensor according to claim 1;
a window bonded with the touch sensor through the upper adhesive layer; and
a display layer bonded with the touch sensor through the lower adhesive layer.

12. The display device according to claim 11, wherein the window is provided with a hard coating film, and further comprises a polarizing layer including a polarizer on one surface of the window.

13. The display device according to claim 12, wherein the window further includes a colored light-shielding pattern printed around an edge of at least one surface of the polarizing layer.

14. The display device according to claim 11, wherein the display layer is an LCD layer or an OLED layer.

* * * * *